(12) United States Patent
Telefont et al.

(10) Patent No.: US 7,468,598 B2
(45) Date of Patent: Dec. 23, 2008

(54) LOW PASS FILTER WITH OUTPUT STABILIZATION

(75) Inventors: Heinz Telefont, Krems (AT); Manfred Schimkowitsch, Vienna (AT)

(73) Assignee: Thales Security Solutions & Services GmbH, Stuttgart (DE)

( * ) Notice: Subject to any disclaimer, the term of this patent is extended or adjusted under 35 U.S.C. 154(b) by 398 days.

(21) Appl. No.: 11/304,809

(22) Filed: Dec. 16, 2005

(65) Prior Publication Data
US 2006/0132088 A1    Jun. 22, 2006

(30) Foreign Application Priority Data
Dec. 17, 2004   (EP)   ................... 04293040

(51) Int. Cl.
*H01M 10/46* (2006.01)
(52) U.S. Cl. ....................................... 320/134
(58) Field of Classification Search ................. 320/128, 320/135, 137, 140, 134, 136
See application file for complete search history.

(56) References Cited

U.S. PATENT DOCUMENTS 6,646,406 B1    11/2003   Pollock et al.

FOREIGN PATENT DOCUMENTS

DE    25 11 718 A1    10/1976

OTHER PUBLICATIONS

N. Lakshminarasamma et al, "A unified model for the ZVS DC-DC converters with active clamp", Power Electronics Specialists Conference, 2004. PESC 04. 2004 IEEE 35th Annual AACHEN, Germany, Jun. 20-25, 2004, Piscataway, NJ, USA, IEEE, US, Jun. 2004, pp. 2441-2447 XP010739657.

*Primary Examiner*—Edward Tso
(74) *Attorney, Agent, or Firm*—Sughrue Mion, PLLC

(57) ABSTRACT

In a filter circuit (6) with a low-pass filter (7), the output of the low-pass filter (7) is regenerated over a reverse current diode (11) with the input of the low-pass filter or of a further low-pass filter (8) pre-connected to the low-pass filter (7). A circuit arrangement includes such a filter circuit (6) and a battery charger circuit (1) with a battery (2) and a d.c. generator (A).

4 Claims, 4 Drawing Sheets

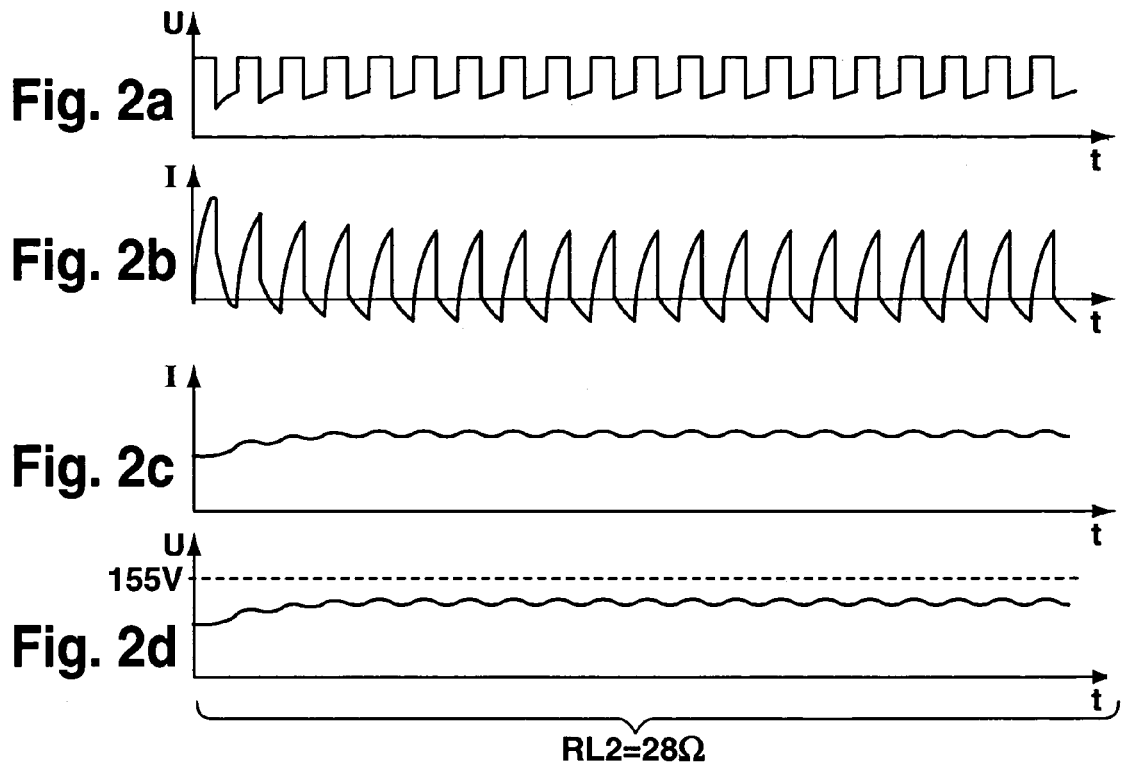
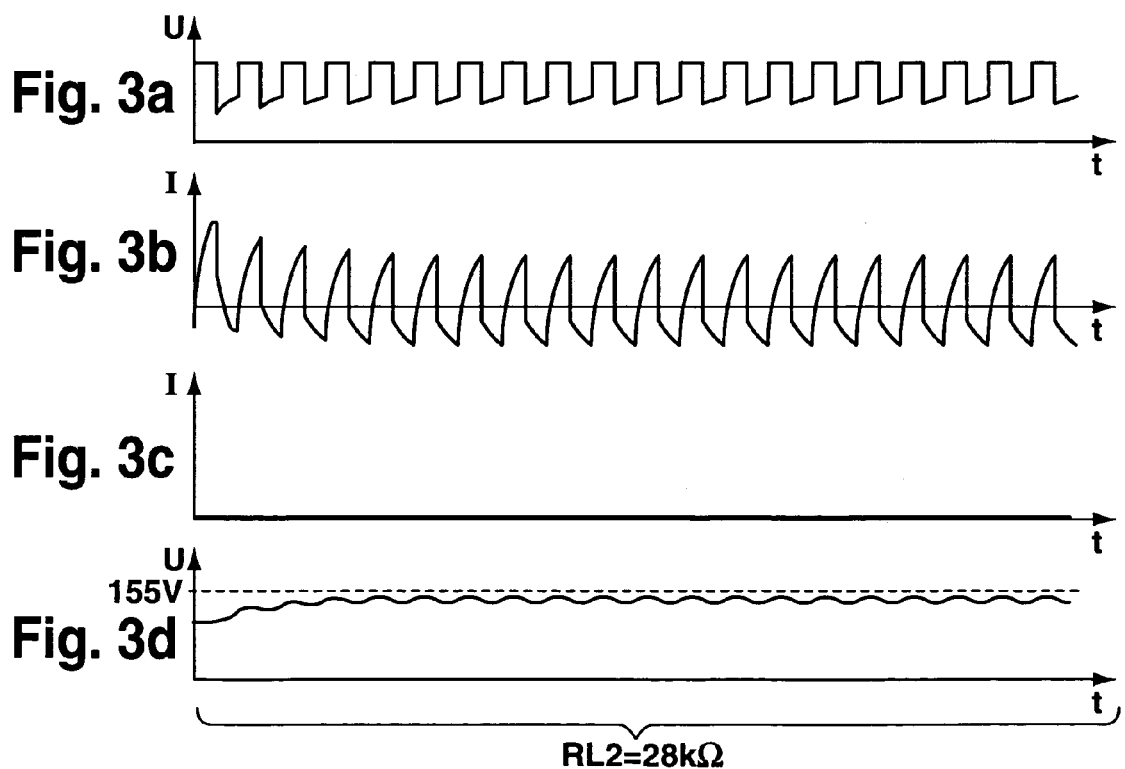

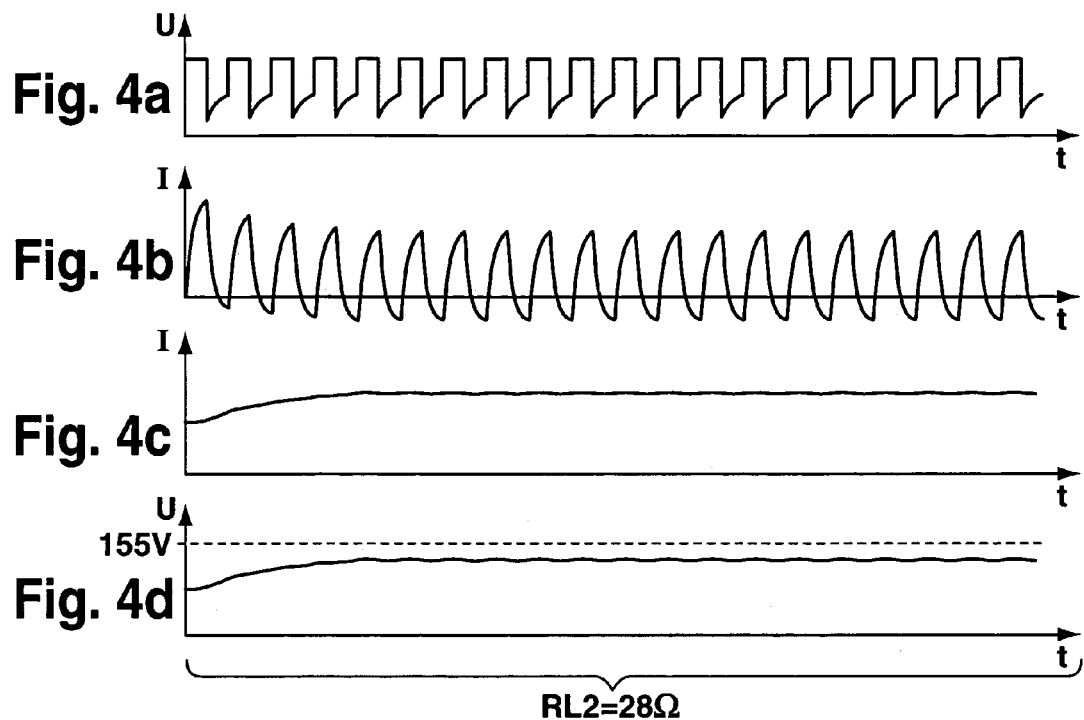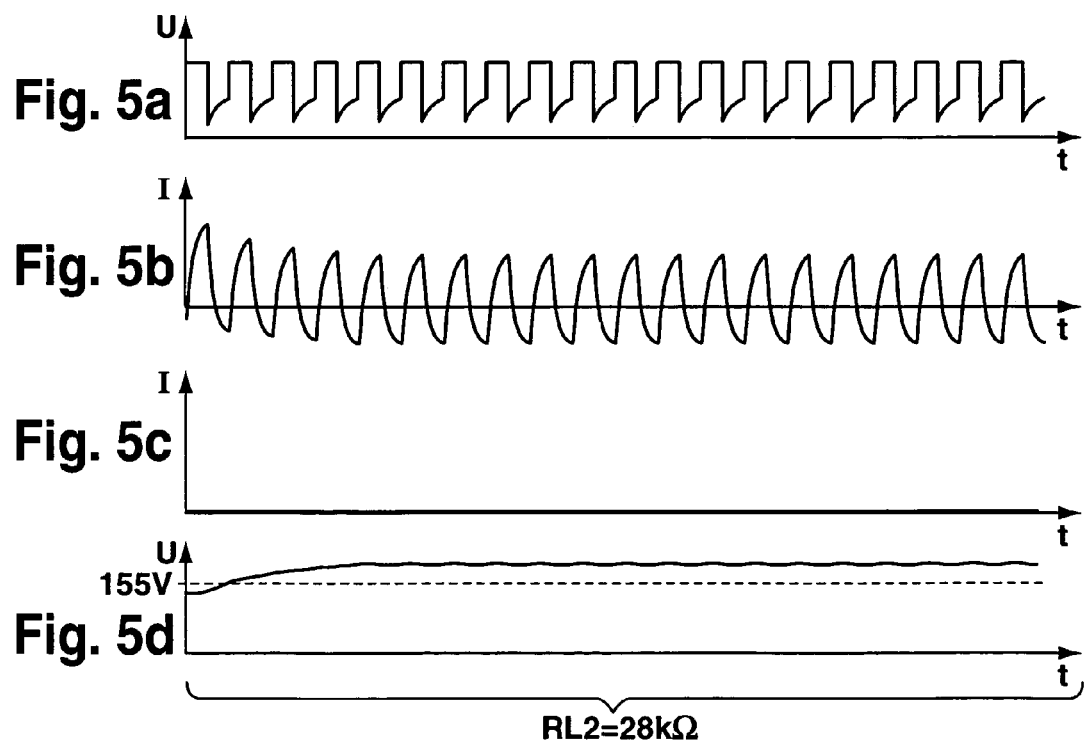

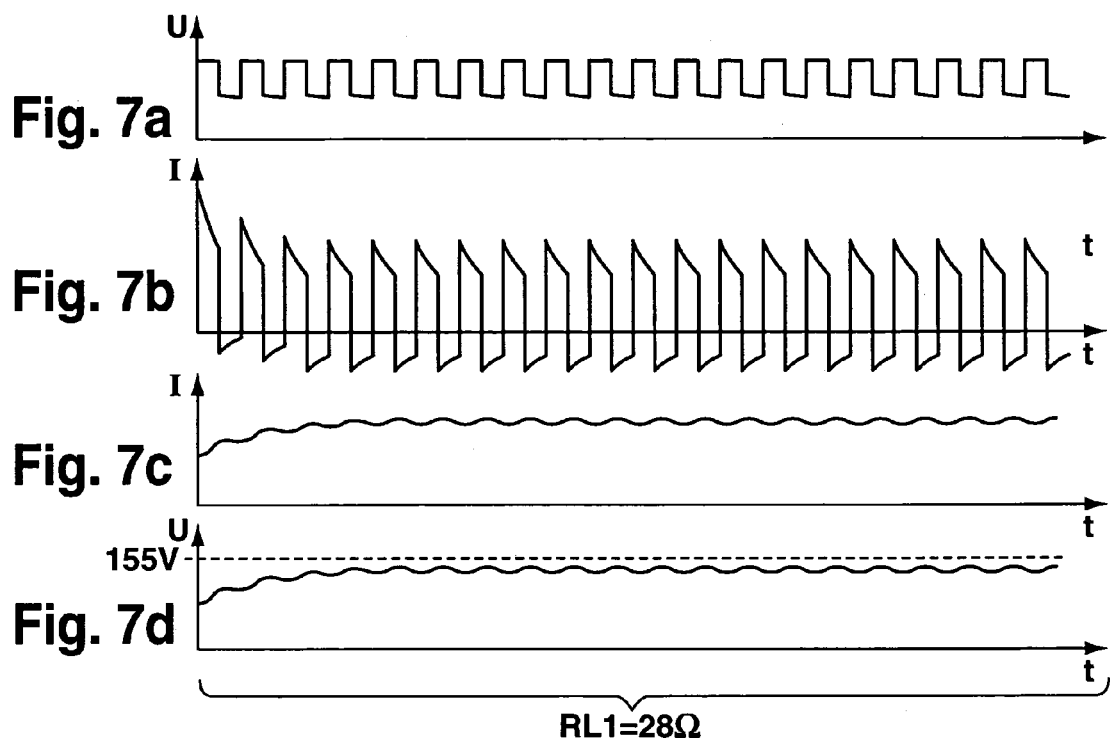
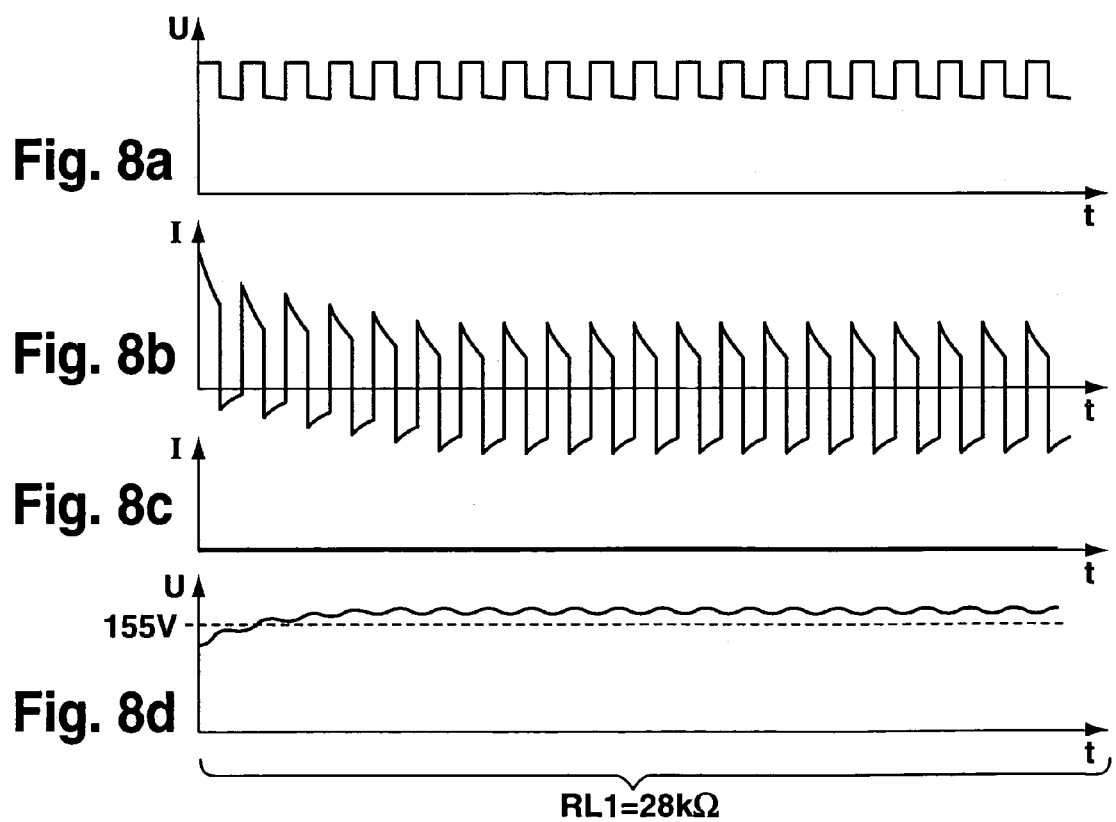

LOW PASS FILTER WITH OUTPUT STABILIZATION

The invention is based on a priority application EP 04293040.4 which is hereby incorporated by reference.

FIELD OF THE INVENTION

The invention relates to a filter circuit with a low-pass filter and a circuit arrangement with the filter circuit.

BACKGROUND OF THE INVENTION

Filter circuits, especially for battery charger circuits, are variously known and are used e.g. in traction vehicles for the railways. FIG. 6 shows a block diagram of a battery charger circuit 1 with a battery 2, which generates a nominal voltage of 110V and has an internal resistance R1. The battery 2 of the traction vehicle is charged through the charge regulator of the on-board supply system, which is represented in the block diagram by an ideal generator A and a diode D1, and charges the battery with a pulsating DC voltage (square-wave voltage) with a maximum value of 230V at 50 Hz.

The square-wave voltage U with a maximum value of 230V at point B of the battery charger circuit 1 is shown in FIG. 7a dependent on the time, the current I at point J of the battery charger circuit 1 in FIG. 7b.

A filter circuit 3 according to prior art for the battery charger circuit 1 is likewise shown in FIG. 6. The filter circuit 3 contains a low-pass filter 5 with a first capacitor C1 with a capacitance of 4700 µF and a first resistance R3 of 2.5Ω. Pre-connected in series to the low-pass filter 5 is a second, identically constructed low-pass filter 4 with a second capacitor C2 and a second resistance R2, which have the same capacitance as the first capacitor C1 and the same resistance value as the first resistance R1 respectively. Electronic equipment linking to the output of the filter circuit 3 is represented in the block diagram of FIG. 6 by a load resistance RL1 corresponding to the input resistance of the electronic equipment. The filter circuit 3 is used for smoothing the voltage supplied by the battery charger circuit 1.

The measured output voltage U of the filter circuit 3 at point C is shown in FIG. 7d, the measured output current I at point K in FIG. 7c for a load resistance RL1 of 28Ω. The maximum value of the output voltage at point C has a value of 155V for a maximum current of 5.53 A. For the electronic equipment following the filter circuit 3, the output voltage of the filter circuit 3 is the relevant value, since in the present case the electronic equipment tolerates a maximum voltage of 155V (broken line in FIG. 7d). A further increase in the output voltage of the filter circuit 3 should therefore be avoided even for a heavier load on the filter circuit 3, determined by a greater input resistance of the electronic equipment.

The output voltage of the filter circuit 3 at point C for a load resistance RL1 raised to 28 kΩ (in comparison to FIG. 7, increased by a factor of 1000) is shown in FIG. 8d, the output current at point K in FIG. 8c. The maximum output voltage at point C is 186V, the maximum current at point K is only 6.65 mA, for which reason it is represented in FIG. 8c based on the chosen scale as a horizontal line at the zero line. The amperage at point J shown in FIG. 8b reduces in comparison to the maximum amperage of 19.1 A of FIG. 7b to a maximum 12.5 A, while the maximum voltage at point B in FIG. 7a as well as FIG. 8a is at a maximum 230V.

It is problematic here for the electronic equipment following the filter circuit 3, that its maximum tolerated input voltage of 155V for a load resistance RL1 (input resistance) of 28 kΩ is exceeded with the output voltage of 186V (FIG. 8d). With the filter circuit 3 it is not possible to convert the widely fluctuating input voltage from the battery charger circuit 1, into a stabilized output voltage.

OBJECT OF THE INVENTION

It is the object of the invention to supply a filter circuit, which converts a sharply fluctuating input voltage at low loss into an output voltage with a maximum voltage as independent of load as possible.

SUMMARY OF THE INVENTION

This object is achieved according to the invention with a filter circuit in which the output of the low-pass filter is regenerated over a reverse current diode with the input of the low-pass filter or of a further low-pass filter pre-connected to the low-pass filter.

The energy stored in the low-pass filter is carried back over the reverse current diode to the voltage input of the low-pass filter and the output voltage is thereby stabilized, while at the same time the resistance to surge voltage and the HF filtering are improved.

In an advantageous embodiment, the low-pass filter(s) include at least one resistance and at least one capacitor. Low-pass filters constructed in this way enable an especially advantageous feedback via the reverse current diode.

In a preferred embodiment, the low-pass filter(s) include a choke. The choke is typically a winding material, e.g. a choke coil, and serves to reduce the output ripple, intensified by the reverse current diode, of the output voltage of the filter circuit.

In an especially preferred embodiment, the low-pass filter and the further low-pass filter are identical in construction. As a result of this, the number of component types and sizes of the components needed for the circuit can be reduced.

The invention also relates to a circuit arrangement with a filter circuit as described above and a battery charger circuit, which includes a battery and a d.c. generator. The d.c. generator generates a square-wave voltage for charging the battery. The input voltage of the filter circuit thus corresponds to the nominal voltage of the battery, on which the square-wave voltage of the generator is superimposed.

In one embodiment, the internal resistance of the reverse current diode is adapted to the internal resistance of the battery in such a way that a maximum current through the reverse current diode is not exceeded. The reverse current diode could be destroyed if the maximum current through it was exceeded.

Further features and advantages of the invention will emerge from the description that follows of an embodiment of the invention, with reference to the figures of the drawing, which show details essential for the invention, and from the claims. The individual features can each be implemented individually alone or with several together in any combination for a variant of the invention.

BRIEF DESCRIPTION OF THE DRAWINGS

One embodiment is represented in the schematic drawing and is explained in the subsequent description. Shown are:

FIGS. 2a-2d show a representation of the current and voltage curve at the output of the battery charger circuit and of the filter circuit of FIG. 1 for a load with a resistance of 28Ω;

FIGS. 3a-3d show a representation corresponding to FIG. 2 for a load with a resistance of 28 kΩ;

FIGS. 4a-4d show a representation of the current and voltage curve at the output of the battery charger circuit and of the filter circuit of FIG. 1 without feedback through a reverse current diode for a load with a resistance of 28Ω;

FIG. 5 a representation corresponding to FIG. 4 for a load with a resistance of 28 kΩ;

FIGS. 7a-7d show a representation of the current and voltage curve at the output of the battery charger circuit and of the filter circuit of FIG. 6 for a load with a resistance of 28Ω; and FIGS. 8a-8d show a representation corresponding to FIG. 7 for a load with a resistance of 28 kΩ.

DETAILED DESCRIPTION OF THE INVENTION

Figure 1:
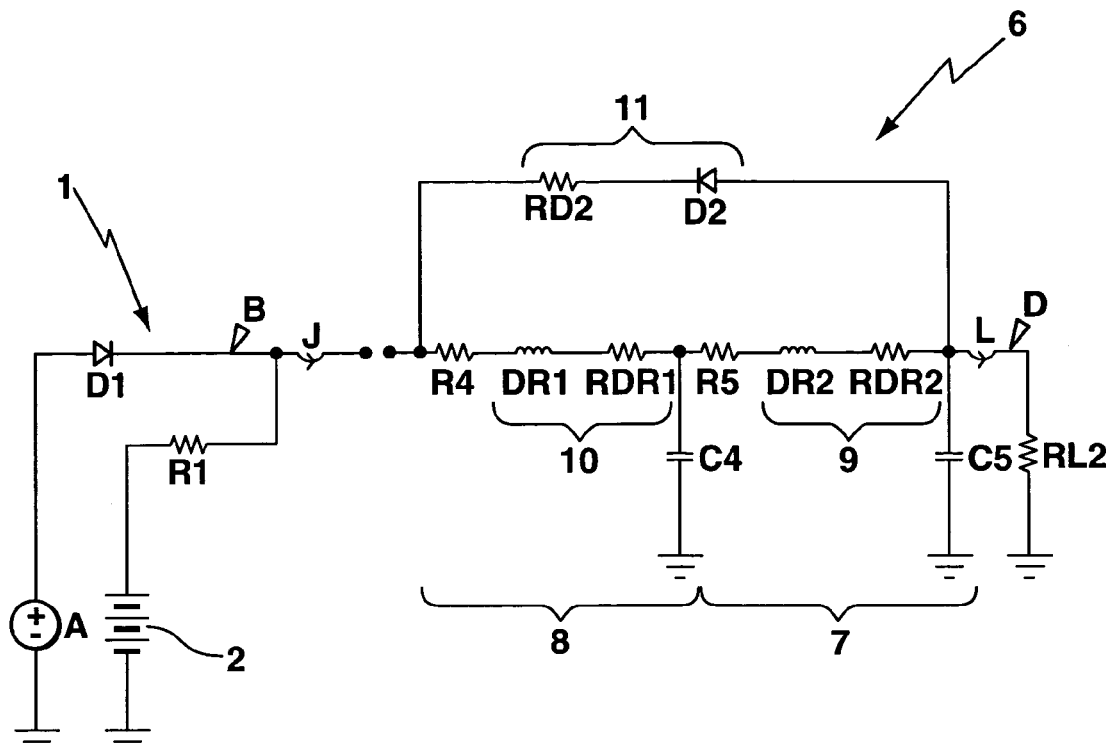
FIG. 1 shows an embodiment of a circuit arrangement with a battery charger circuit and a filter circuit with reverse current diode according to the invention.
Figure 6:
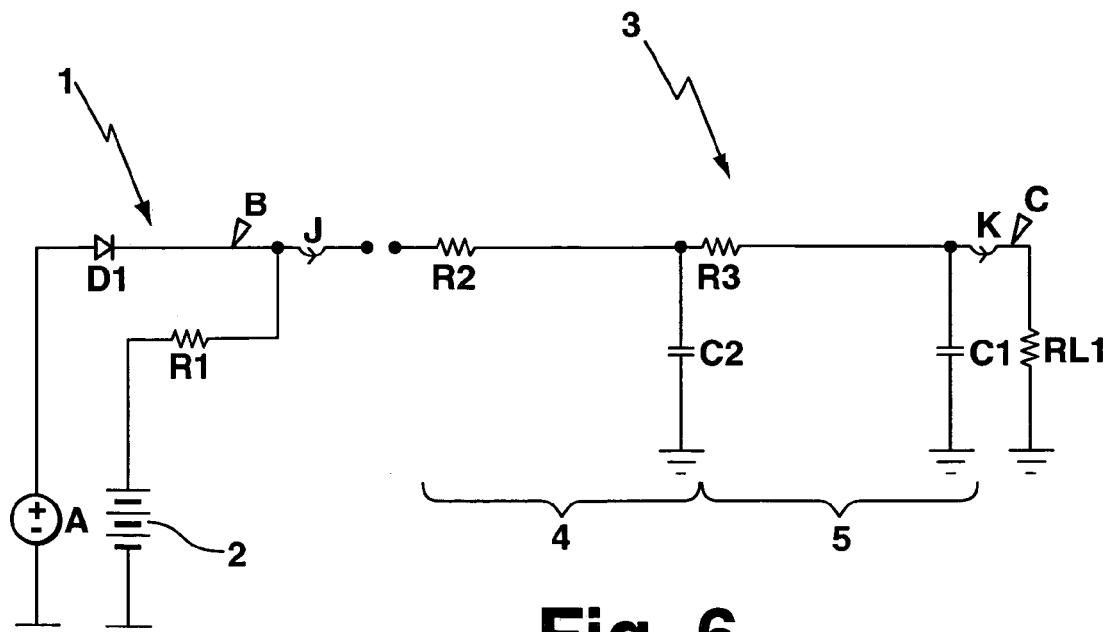
FIG. 6 a circuit arrangement with a battery charger circuit and a filter circuit according to prior art.

FIG. 1 shows a block diagram of a circuit arrangement with a battery charger circuit 1 (see FIG. 6) and a filter circuit 6 with a low-pass filter 7, which has a capacitor C5 with 4700 μF and a resistance R5 of 2.0Ω. Arranged in series to the resistance R5 is a coil as choke 9, which is represented in the block diagram by an inductance DR2 of 13 mH and an internal resistance RDR2 of 0.5Ω. A further identically constructed low-pass filter 8 is pre-connected to the low-pass filter 7 and has a further capacitor C4 and a further resistance R4 as well as a further choke 10, which consists of an internal resistance RDR1 and an inductance DR1. The chokes 9 & 10 serve for reduction of the ripple of the output voltage of the filter circuit 6.

Arranged between the output of the low-pass filter 7 and the input of the further low-pass filter 8 is a reverse current diode 11, which is represented in the block diagram by an ideal diode D2 and a diode resistor RD2. The reverse current diode 11 is switched such that it enables a current flow from the output of the low-pass filter 7 to the input of the further low-pass filter 8, simultaneously preventing a current flow in the opposite direction. Electronic equipment following the filter circuit 6 is represented by an input resistance RL2.

The diode resistor RD2 limits the return of current and is adapted to the internal resistance R1 of the battery 2 of battery charger circuit 1, so that the maximum current of the reverse current diode is not exceeded.

FIG. 2 shows, for a load resistance RL2 of 28Ω, the voltage curve at point B (FIG. 2a) and the current path at point J (FIG. 2b) at the output of the battery charger circuit 1, and the current path at point L (FIG. 2c) and the voltage curve at point D (FIG. 2d) at the output of the filter circuit 6. The maximum voltage at point D is at a value of 135V, thus well below the limit of 155V at which the subsequent electronic equipment is too heavily loaded.

FIG. 3 shows the currents (FIGS. 3b and 3c) and voltages (FIGS. 3a and 3d) at the points B, J and L, D for an increased load resistance RL2 of 28 kΩ. Even with increased load resistance RL2, the voltage at point D only has a maximum value of 155V, and is thus within the range tolerated by the subsequent electronic equipment.

FIG. 4 and FIG. 5 show the currents (FIGS. 4b, 4c and 5b, 5c) and voltages (FIGS. 4a, 4d and 5a, 5d) at the points B, J and L, D respectively for a filter circuit 6 loaded with a load resistance of 28Ω or 28 kΩ, when the feedback through the reverse current diode 11 is not present. The maximum value of the voltage at point D is 144V (see FIG. 4d) for the load resistance of 28Ω, 175V (see FIG. 5d) for the load resistance of 28 kΩ.

From a comparison of the maximum voltage values at point D in FIGS. 2d and 3d with the values of FIGS. 4d and 5d, it becomes clear that as a result of the feedback with the reverse current diode 11, the voltage value at point D is reduced and the input voltage for the subsequent electronic equipment is limited in its rise, if a considerable increase of the load resistance RL2 is effected. This result can be achieved by the reverse current diode 11, without the need for considerable additional circuit complexity or active electronic equipment. As well as the smoothing of the output voltage, the filter circuit 6 thus enables in a simple manner a stabilization of the output voltage.

The invention claimed is:

1. A circuit arrangement with a filter circuit with a low-pass filter, where the output of the low-pass filter is regenerated over a reverse current diode with the input of the low-pass filter or of a further low-pass filter pre-connected to the low-pass filter, wherein the circuit arrangement comprises a battery charger circuit, which includes a battery and a d.c. generator, an internal resistance of the reverse current diode being adapted to an internal resistance of the battery to prevent a maximum current through the reverse current diode from being exceeded.

2. A circuit arrangement according to claim 1, wherein the low-pass filter(s) include at least one resistance and at least one capacitor.

3. A circuit arrangement according to claim 1, wherein the low-pass filter(s) include a choke.

4. A circuit arrangement according to claim 1, wherein the low-pass filter and the further low-pass filter are identical in construction.

* * * * *